(12) United States Patent
Moriya et al.

(10) Patent No.: US 9,751,109 B2
(45) Date of Patent: Sep. 5, 2017

(54) ACOUSTIC WAVE DEVICE AND METHOD OF FABRICATING THE SAME

(71) Applicant: TAIYO YUDEN CO., LTD., Tokyo (JP)

(72) Inventors: Akira Moriya, Kanagawa (JP); Osamu Kawachi, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 636 days.

(21) Appl. No.: 14/290,746

(22) Filed: May 29, 2014

(65) Prior Publication Data

US 2014/0354114 A1    Dec. 4, 2014

(30) Foreign Application Priority Data

Jun. 3, 2013    (JP) .................. 2013-117326

(51) Int. Cl.

| | |
|---|---|
| *H03H 9/25* | (2006.01) |
| *B06B 1/06* | (2006.01) |
| *H03H 3/08* | (2006.01) |
| *H03H 9/05* | (2006.01) |
| *H03H 9/10* | (2006.01) |

(52) U.S. Cl.
CPC ............. *B06B 1/0662* (2013.01); *H03H 3/08* (2013.01); *H03H 9/0547* (2013.01); *H03H 9/1071* (2013.01); *Y10T 29/42* (2015.01)

(58) Field of Classification Search
CPC ...... B06B 1/0662; H03H 3/08; H03H 9/0547; H03H 9/1071
USPC ............... 310/311–371; 333/186–193
See application file for complete search history.

(56) References Cited

U.S. PATENT DOCUMENTS

| | | | |
|---|---|---|---|
| 8,008,837 B2 * | 8/2011 | Fukano | H03H 9/059 29/25.35 |
| 9,237,668 B2 * | 1/2016 | Kojo | H01L 41/0533 |
| 2004/0226162 A1 | 11/2004 | Miura et al. | |

(Continued)

FOREIGN PATENT DOCUMENTS

| | | | | |
|---|---|---|---|---|
| JP | 10022763 A | * | 1/1998 | ............... H03H 3/08 |
| JP | 2004-343359 A | | 12/2004 | |

(Continued)

OTHER PUBLICATIONS

Japanese Office Action dated May 9, 2017, in a counterpart Japanese patent application No. 2013-117326.

*Primary Examiner* — Thomas Dougherty
(74) *Attorney, Agent, or Firm* — Chen Yoshimura LLP

(57) ABSTRACT

An acoustic wave device includes: a support substrate; a piezoelectric substrate; and a cap substrate, wherein the cap substrate includes a first region located along an outer peripheral portion of the cap substrate, a second region located along an inside of the first region and having a thickness less than a thickness of the first region, and a third region located inside the second region and having a thickness less than a thickness of the second region, and a surface of the first region is bonded to the surface of the outer peripheral portion of the support substrate, a surface of the second region is bonded to a surface of an outer peripheral portion of the piezoelectric substrate, and a surface of the third region is located away from a surface of the piezoelectric substrate to form a space for the excitation electrode to vibrate.

10 Claims, 12 Drawing Sheets

(56) References Cited

U.S. PATENT DOCUMENTS

2010/0038992 A1\* 2/2010 Moriya .............. H03H 9/02574
310/313 B
2014/0339956 A1\* 11/2014 Kanae .................. H03H 9/1071
310/311

FOREIGN PATENT DOCUMENTS

| JP | 2008-060382 A | 3/2008 | |
|---|---|---|---|
| JP | 2009-100328 A | 5/2009 | |
| JP | 2009-188844 A | 8/2009 | |
| JP | 2009-278654 A | 11/2009 | |
| JP | 5277971 B2 \* | 8/2013 | ............... H03H 9/25 |

\* cited by examiner

FIG. 2A
FIG. 2B
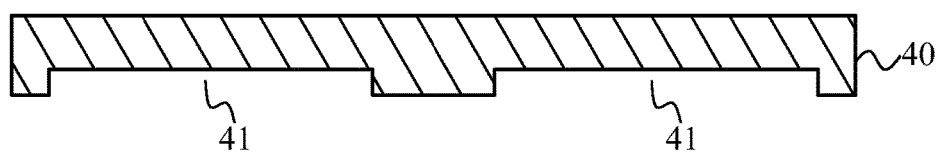
FIG. 2C
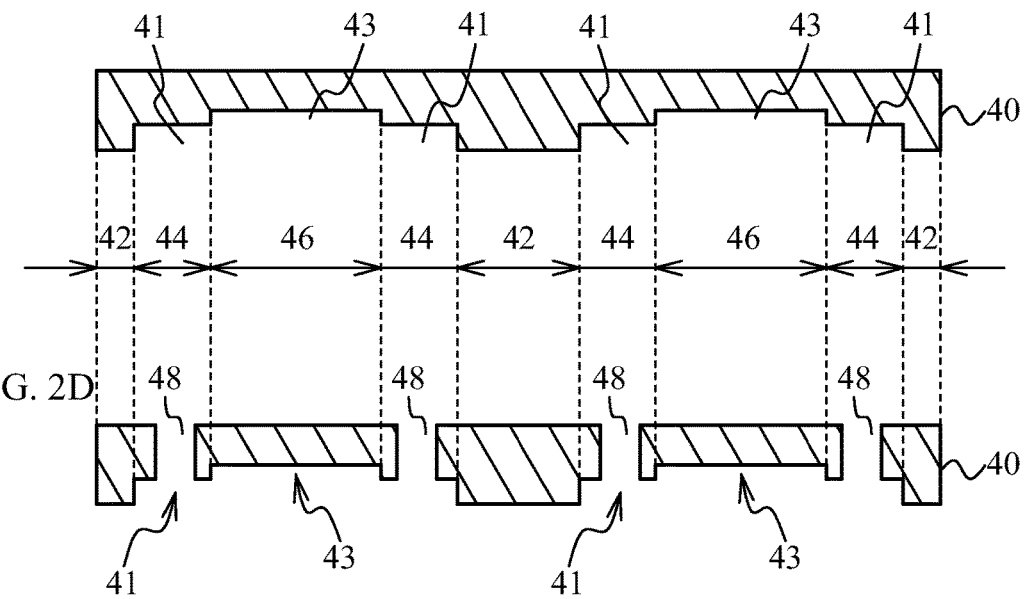
FIG. 2D

“ACOUSTIC WAVE DEVICE AND METHOD OF FABRICATING THE SAME”

CROSS-REFERENCE TO RELATED APPLICATION

This application is based upon and claims the benefit of priority of the prior Japanese Patent Application No. 2013-117326, filed on Jun. 3, 2013, the entire contents of which are incorporated herein by reference.

FIELD

A certain aspect of the present invention relates to an acoustic wave device and a method of fabricating the same.

BACKGROUND

There has been conventionally known an acoustic wave device in which an excitation electrode exciting an acoustic wave is located on a piezoelectric substrate and a functional element including the excitation electrode is sealed by a resin as disclosed in Japanese Patent Application Publication No. 2009-188844. In the aforementioned acoustic wave device, the resin seals the functional element so that an air-space (space) is formed above the excitation electrode.

In the conventional acoustic wave device, a resin is used as a sealing material, and thus the hermeticity is not sufficient, and the penetration of moisture damages the excitation electrode and decreases the reliability of the device.

SUMMARY OF THE INVENTION

According to an aspect of the present invention, there is provided an acoustic wave device including: a support substrate; a piezoelectric substrate located on the support substrate so that a surface of an outer peripheral portion of the support substrate is exposed; an excitation electrode located on the piezoelectric substrate and exciting an acoustic wave; and a cap substrate located on the support substrate and the piezoelectric substrate and made of an inorganic insulating material, wherein the cap substrate includes a first region located along an outer peripheral portion of the cap substrate, a second region located along an inside of the first region and having a thickness less than a thickness of the first region, and a third region located inside the second region and having a thickness less than a thickness of the second region, and a surface of the first region is bonded to the surface of the outer peripheral portion of the support substrate, a surface of the second region is bonded to a surface of an outer peripheral portion of the piezoelectric substrate, and a surface of the third region is located away from a surface of the piezoelectric substrate to form a space for the excitation electrode to vibrate.

According to another aspect of the present invention, there is provided a method of fabricating an acoustic wave device including: providing a piezoelectric substrate on a support substrate so that a surface of an outer peripheral portion of the support substrate is exposed; providing an excitation electrode on the piezoelectric substrate, the excitation electrode exciting an acoustic wave; forming a first region, a second region, and a third region in a cap substrate made of an inorganic insulating material, the first region being located along an outer peripheral portion of the cap substrate, the second region being located along an inside of the first region and having a thickness less than a thickness of the first region, and the third region being located inside the second region and having a thickness less than a thickness of the second region; and sealing the excitation electrode by the cap substrate by bonding a surface of the first region to the surface of the outer peripheral portion of the support substrate, bonding a surface of the second region to a surface of an outer peripheral portion of the piezoelectric substrate, and locating a surface of the third region away from a surface of the piezoelectric substrate to form a space for the excitation electrode to vibrate.

BRIEF DESCRIPTION OF THE DRAWINGS

FIG. 2A through FIG. 2D are schematic cross-sectional views (No. 2) illustrating the fabrication process of the acoustic wave device in accordance with the first embodiment;

DETAILED DESCRIPTION

First Embodiment

Figure 1A:
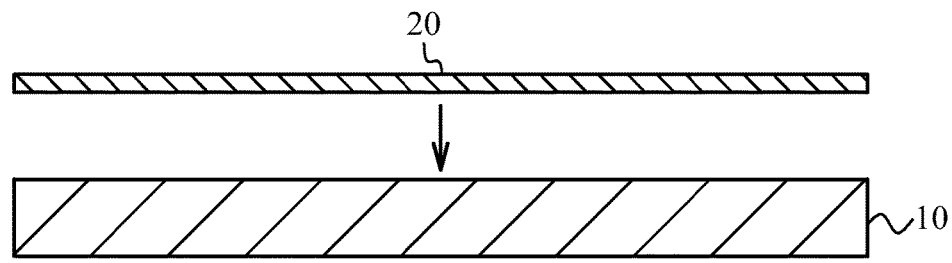
FIG. 1A through FIG. 1D are schematic cross-sectional views (No. 1) illustrating a fabrication process of an acoustic wave device in accordance with a first embodiment.
Figure 1B:
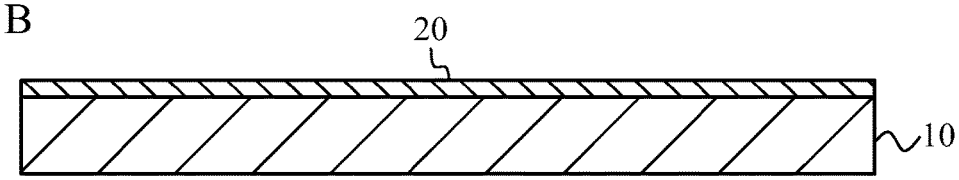

FIG. 1A through FIG. 4C are schematic cross-sectional views illustrating a fabrication process of an acoustic wave device in accordance with a first embodiment. First, as illustrated in FIG. 1A and FIG. 1B, a piezoelectric substrate 20 is bonded to a support substrate 10. The support substrate 10 may be made of, for example, sapphire, alumina, or silicon. The piezoelectric substrate 20 may be an LT ($LiTaO_3$: lithium tantalate) substrate or an LN ($LiNbO_3$:

lithium niobate) substrate. The support substrate 10 may be bonded to the piezoelectric substrate 20 by room-temperature direct bonding that activates a bonding surface by plasma (see Japanese Patent Application Publication No. 2004-343359) or with an adhesive agent (e.g. an epoxy-based resin).

Figure 1C:
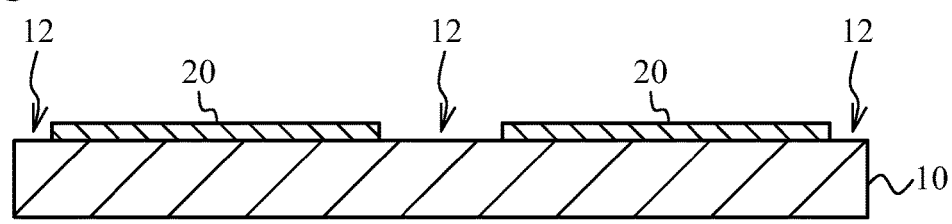

Then, as illustrated in FIG. 1C, a part of the piezoelectric substrate 20 is removed by half dicing. This process exposes the surface of the support substrate 10 from a region 12 in which the piezoelectric substrate 20 is removed. For a bonding step described later, the region 12 in which the piezoelectric substrate 20 is removed preferably surrounds the whole of the periphery of the remaining piezoelectric substrate 20. Blade dicing may be employed for half dicing of the piezoelectric substrate 20.

Figure 1D:
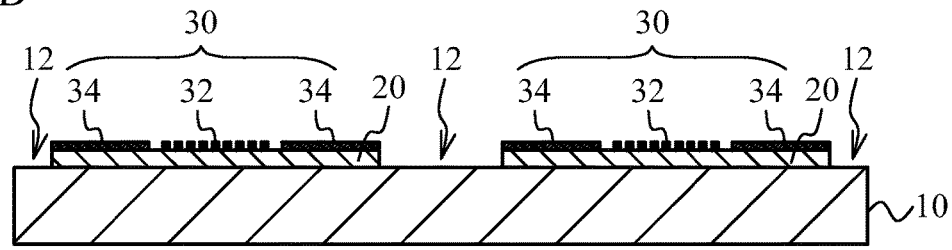

Then, as illustrated in FIG. 1D, a metal layer 30 is formed on the surface of the piezoelectric substrate 20, and excitation electrodes 32 and electrode patterns of wiring electrodes 34 coupled to the excitation electrodes 32 are formed by patterning. This process forms a functional element of the acoustic wave device on the piezoelectric substrate 20. The metal layer 30 may be made of, for example, aluminum.

FIG. 2A through FIG. 2D are diagrams illustrating a step of processing a cap substrate 40. The cap substrate 40 is a member for sealing the functional element of the acoustic wave device formed through the process illustrated in FIG. 1A through FIG. 1D, and is made of an inorganic insulating material such as sapphire or alumina. As illustrated in FIG. 2A and FIG. 2B, first recess portions 41 are formed in the cap substrate 40 in locations corresponding to the piezoelectric substrates 20 of FIG. 1D. The first recess portion 41 is formed so as to have a thickness greater than that of the piezoelectric substrate 20 (e.g. 100 μm~200 μm).

Then, as illustrated in FIG. 2C, a second recess portion 43 is formed in the first recess portion 41 in a location corresponding to the excitation electrodes 32 of FIG. 1D. The second recess portion 43 is formed so as to have a thickness greater than that of the metal layer 30 (e.g. 1 μm). The first recess portion 41 and the second recess portion 43 divide the cap substrate 40 into three regions: a first region 42 with the same thickness as the original cap substrate 40; a second region 44 with a thickness less than that of the first region 42 by the thickness of the first recess portion 41; and a third region 46 with a thickness less than that of the second region 44 by the thickness of the second recess portion 43. In other words, the first recess portion 41 and the second recess portion 43 are formed in the same surface, and thereby the cap substrate 40 has three levels in the surface.

Then, as illustrated in FIG. 2D, formed are penetration holes 48 penetrating through the second region 44 of the cap substrate 40. The formation of a penetrating electrode in the penetration hole 48 in the step described later allows both surfaces of the cap substrate 40 to be electrically interconnected. The first recess portion 41, the second recess portion 43, and the penetration hole 48 are formed by, for example, sandblasting.

Figure 3A:
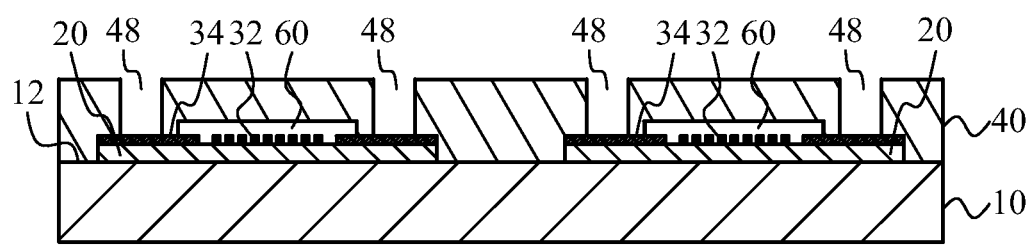
FIG. 3A and FIG. 3B are schematic cross-sectional views (No. 3) illustrating the fabrication process of the acoustic wave device in accordance with the first embodiment.

Then, as illustrated in FIG. 3A, the cap substrate 40 is bonded to the support substrate 10 and the piezoelectric substrate 20. At this time, the first region 42 of the cap substrate 40 is bonded to the surface of the support substrate 10 (the exposed part indicated by reference numeral 12 in FIG. 1C and FIG. 1D), and the second region 44 of the cap substrate 40 is bonded to the surface of the piezoelectric substrate 20. In addition, the third region 46 of the cap substrate 40 is located away from the surface of the piezoelectric substrate 20, and this forms a space 60 for the excitation electrodes 32. Furthermore, the penetration hole 48 of the cap substrate 40 is located above the wiring electrode 34, and this structure allows the excitation electrodes 32 and the wiring electrodes 34 to be electrically connected to the outside through the penetration hole 48.

Figure 3B:
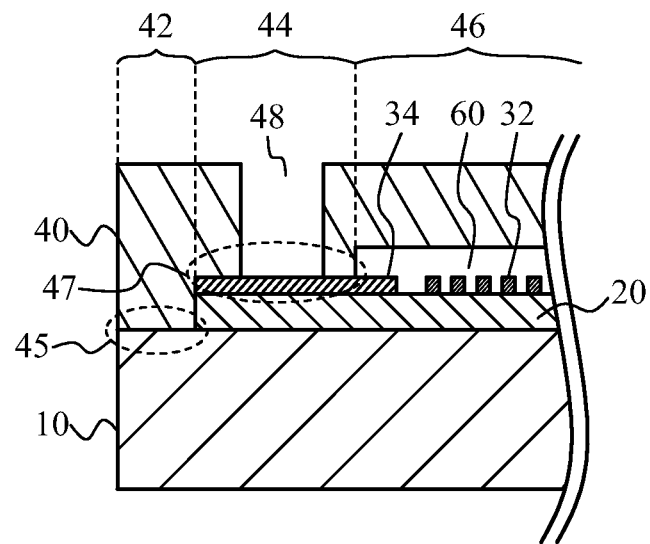

FIG. 3B is an enlarged view of a part of FIG. 3A. The first region 42 of the cap substrate 40 is bonded to the support substrate 10 in a region 45, and the second region 44 of the cap substrate 40 is bonded to the piezoelectric substrate 20 in a region 47. The previously-described room-temperature direct bonding may be used for bonding, but an adhesive agent (e.g. an epoxy-based resin) may be used for bonding.

In the drawings, it seems that the second region 44 of the cap substrate 40 is bonded not to the piezoelectric substrate 20 but to the wiring electrode 34. However, the thickness of the wiring electrode 34 (e.g. 1 μm) is negligible small compared to the thickness of the piezoelectric substrate 20 (e.g. 100 μm~200 μm), and thus the second region 44 is practically bonded to the surface of the piezoelectric substrate 20. Therefore, the term "the second region 44 is bonded to the piezoelectric substrate 20" includes the state where the second region 44 is bonded to the wiring electrode 34.

Figure 4A:
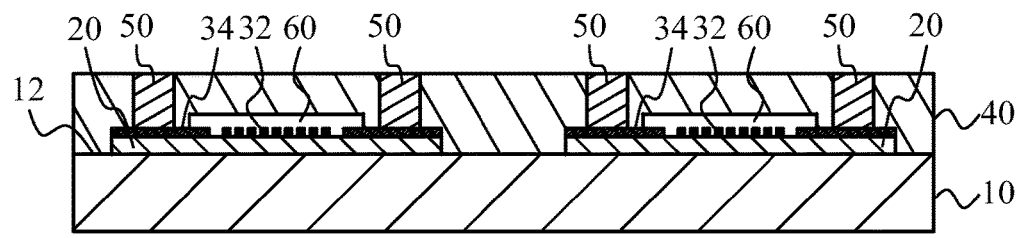
FIG. 4A through FIG. 4C are schematic cross-sectional views (No. 4) illustrating the fabrication process of the acoustic wave device in accordance with the first embodiment.

Then, as illustrated in FIG. 4A, a penetrating electrode 50 is formed in the penetration hole 48 of the cap substrate 40. The penetrating electrode 50 is made of, for example, copper or nickel. The penetrating electrode 50 is formed by, for example, plating. However, the penetrating electrode 50 may be formed by print. The penetrating electrode 50 is formed from the surface of the cap substrate 40 at the support substrate 10 side to the opposite surface.

Figure 4B:
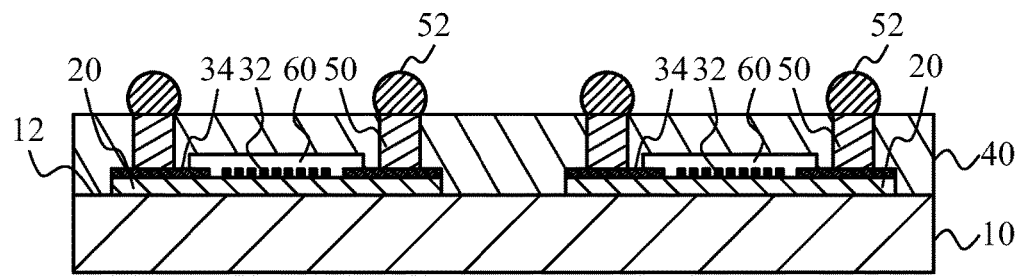
Figure 4C:
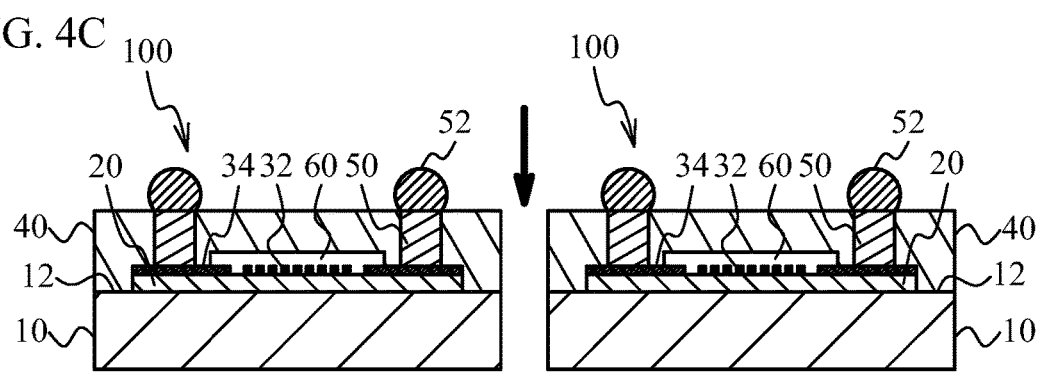

Then, as illustrated in FIG. 4B, solder balls 52 to be terminals for external connection are formed on the surface of the penetrating electrode 50. Then, as illustrated in FIG. 4C, the acoustic wave devices in a wafer state are cut at a position indicated by an arrow, and separated into individual devices. The above-described process completes an acoustic wave device 100 in accordance with the first embodiment.

Figure 5:
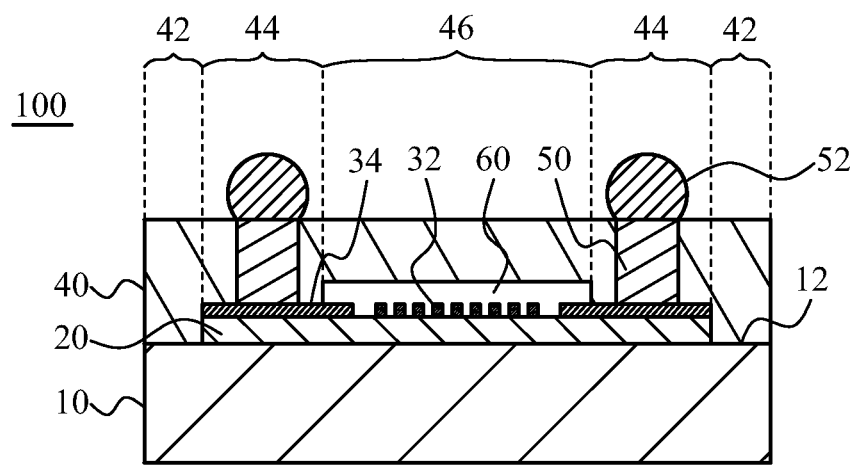
FIG. 5 is a schematic cross-sectional view illustrating a structure of the acoustic wave device in accordance with the first embodiment.

FIG. 5 is a schematic cross-sectional view illustrating a structure of the acoustic wave device 100 in accordance with the first embodiment. The piezoelectric substrate 20 is located on the support substrate 10 so that the surface 12 of the outer peripheral portion of the support substrate 10 is exposed. On the piezoelectric substrate 20, located are the excitation electrodes 32 exciting the acoustic wave and the wiring electrodes 34 electrically connected to the excitation electrodes 32. The cap substrate 40 made of an inorganic insulating material is located on the support substrate 10 and the piezoelectric substrate 20. The first region 42 of the cap substrate 40 is bonded to the surface 12 of the support substrate 10, the second region 44 of the cap substrate 40 is bonded to the surface of the piezoelectric substrate 20, and the third region 46 of the cap substrate 40 is located away from the surface of the piezoelectric substrate 20 to form the space 60.

Figure 6A:
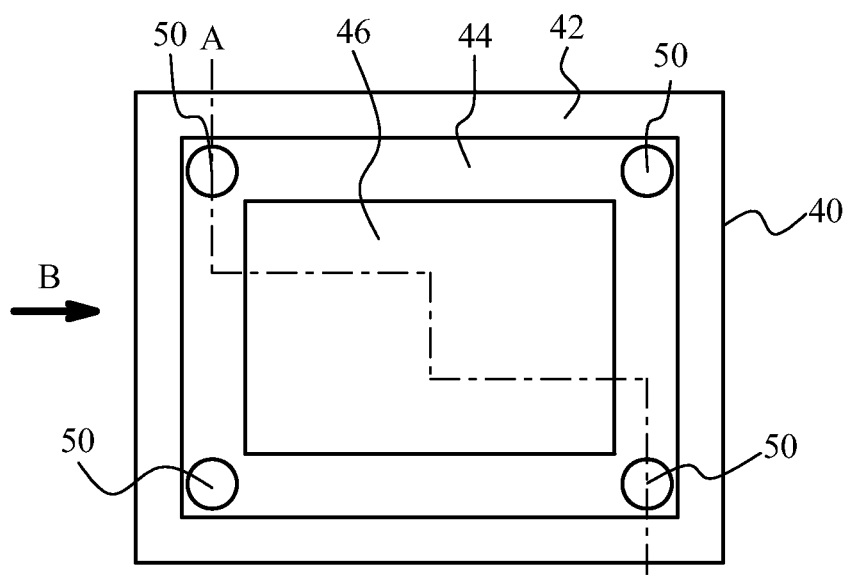
FIG. 6A and FIG. 6B are schematic plan views illustrating the structure of the acoustic wave device in accordance with the first embodiment.
Figure 6B:
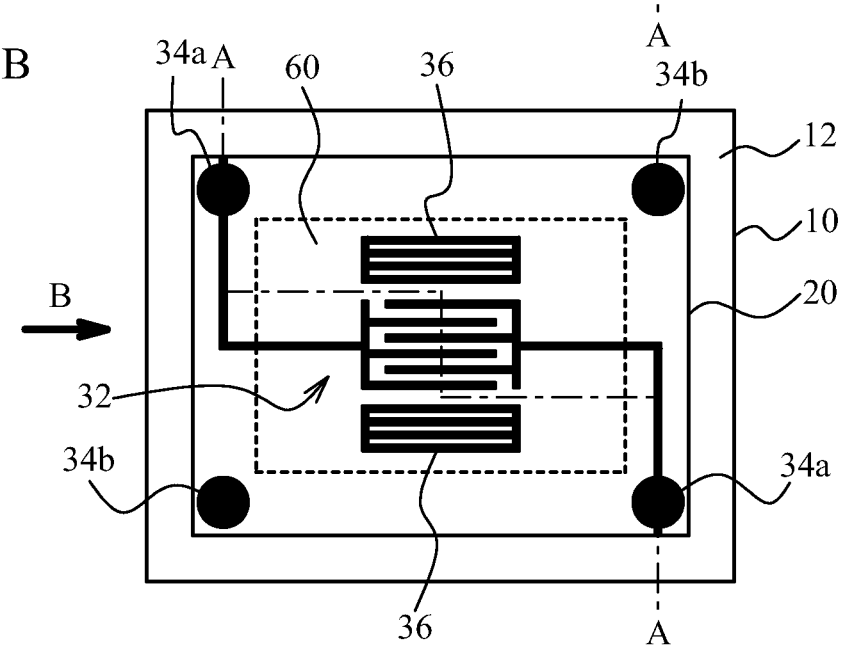

FIG. 6A and FIG. 6B are schematic plan views illustrating the structure of the acoustic wave device 100 in accordance with the first embodiment, FIG. 6A illustrates the structure when the cap substrate 40 is viewed from the support substrate 10 side, and FIG. 6B illustrates the structure when the support substrate 10 is viewed from the cap substrate 40 side. FIG. 5 corresponds the diagram when the cross-section taken along line A-A in FIG. 6A and FIG. 6B is viewed from the direction indicated by arrow B. As illustrated in FIG. 6B, the excitation electrodes 32 facing each other and reflection electrodes 36 located at both sides thereof are located on the piezoelectric substrate 20. Input/output pads 34a for inputting/outputting signals and ground pads 34b are located in four corners of the piezoelectric substrate 20. A first one of the input/output pads 34a is electrically connected to a first one of the excitation electrodes 32, and a second one of the input/output pads 34a is electrically connected to a second one of the excitation electrodes 32. The exposed part 12 of the support substrate 10 is located so as to surround the whole of the piezoelectric substrate 20. The space 60 is located in the region defined by the dotted line. In FIG. 6A and FIG. 6B, a resonator is formed on the piezoelectric substrate 20, but an acoustic wave device including a filter such as a ladder-type filter and/or a multimode filter may be formed on the piezoelectric substrate 20.

As illustrated in FIG. 6A, the cap substrate 40 includes the first region 42 located along the outer peripheral portion of the cap substrate 40, the second region 44 located along the inside of the first region 42, and the third region 46 located inside the second region 44. The penetrating electrodes 50 are located in four corners of the second region 44 in locations corresponding to the input/output pads 34a and the ground pads 34b of the piezoelectric substrate 20. As illustrated in FIG. 6A and FIG. 6B, the first region 42 is located so as to overlap with the exposed part 12 of the support substrate 10, and the second region 44 is located along the outer peripheral portion of the piezoelectric substrate 20.

In the acoustic wave device 100 of the first embodiment, the first region 42 of the cap substrate 40 is bonded to the support substrate 10, and the second region 44 is bonded to the piezoelectric substrate 20. As described above, the hermeticity can be improved by bonding the cap substrate 40 to both the support substrate 10 and the piezoelectric substrate 20 compared to a case where a sealing material (e.g. a sealing resin) is bonded only to the piezoelectric substrate 20. In addition, the use of an inorganic insulating material to the cap substrate 40 improves the hermeticity compared to the use of a resin. As described above, the acoustic wave device 100 of the first embodiment improves the sealing performance and the reliability of the acoustic wave device 100.

Here, the support substrate 10 and the cap substrate 40 are preferably made of a material with a linear expansion coefficient less than that of the piezoelectric substrate 20. This configuration can reduce the expansion amount to the temperature change of the piezoelectric substrate 20 and further improve the temperature characteristics of the acoustic wave device 100 (see Japanese Patent Application Publication No. 2009-188844).

Additionally, the support substrate 10 and the cap substrate 40 are preferably made of the same material. This configuration allows the support substrate 10 and the cap substrate 40 to have the same linear expansion coefficient, and thereby further improves the temperature characteristics of the acoustic wave device 100.

Second Embodiment

A second embodiment uses a multichip module.

Figure 7A:
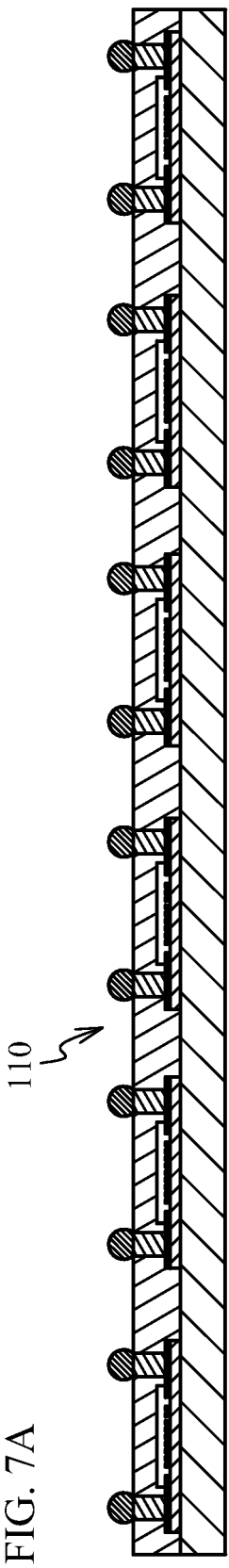
FIG. 7A through FIG. 7C are schematic cross-sectional views illustrating a structure and a fabrication process of an acoustic wave device in accordance with a second embodiment.
Figure 7B:
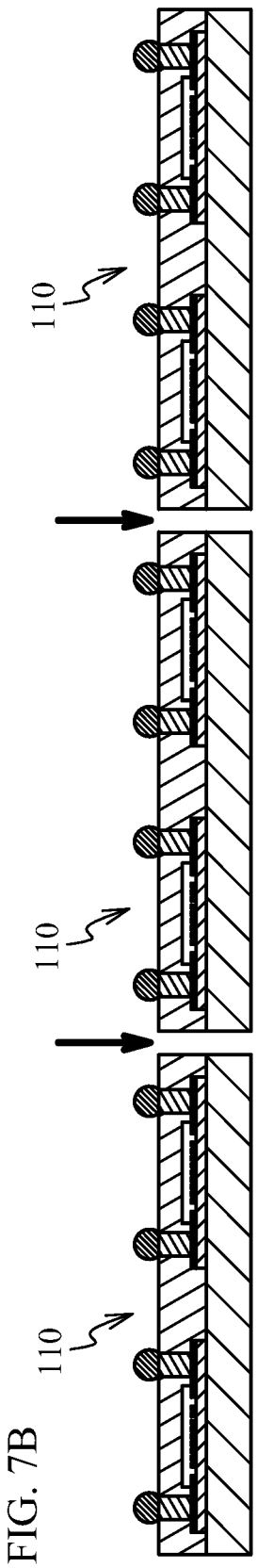
Figure 7C:
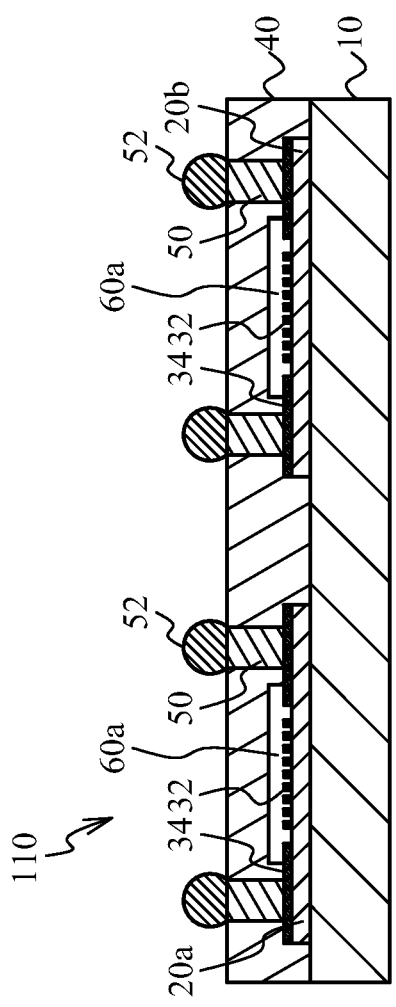

FIG. 7A through FIG. 7C are schematic cross-sectional views illustrating a fabrication process and a structure of an acoustic wave device in accordance with the second embodiment. FIG. 7A and FIG. 7B illustrate the fabrication process and FIG. 7C illustrates a structure of a finished product. FIG. 7A is the same diagram as the diagram (FIG. 4B) illustrating the step of forming the solder ball 52 in the first embodiment. The steps prior to this step in the second embodiment are the same as those in the first embodiment, and thus the detailed description thereof is omitted. FIG. 7A and FIG. 7B omit detailed reference numerals to elements, and the details of the elements should be referred to the description of FIG. 7C.

As illustrated in FIG. 7A and FIG. 7B, acoustic wave devices 110 are cut and separated into individual devices after the formation of the solder balls 52. At this time, unlike the first embodiment (FIG. 4C), the acoustic wave devices 110 are cut so that one support substrate 10 includes the piezoelectric substrates 20 and the spaces 60. The cap substrate 40 may be shared by the piezoelectric substrates 20 and the spaces 60. The above-described steps complete the acoustic wave device 110 in accordance with the second embodiment.

As illustrated in FIG. 7C, piezoelectric substrates 20a and 20b located away from each other are located on the single support substrate 10, and sealed by the single cap substrate 40. Thereby, spaces 60a and 60b are formed so as to correspond the respective piezoelectric substrates. Other structures are the same as the first embodiment (FIG. 5), and a detailed description is omitted.

The acoustic wave device 110 of the second embodiment is a multichip module in which the piezoelectric substrates 20 and the spaces 60 are located in the single space. Even in this case, as with the first embodiment, the hermeticity and the reliability of the acoustic wave device 110 can be improved by forming a level difference in the cap substrate 40, bonding the first region 42 to the support substrate 10, and bonding the second region 44 to the piezoelectric substrate 20.

Additionally, in the acoustic wave device 110 of the second embodiment, the piezoelectric substrates 20a and 20b are located away from each other, and therefore the isolation between them is improved. For example, when a duplexer including both a transmit filter and a receive filter is formed on the single support substrate 10, the interference between the two filters can be suppressed and the reliability can be improved by forming the transmit filter on the piezoelectric substrate 20a and forming the receive filter on the piezoelectric substrate 20b.

Third Embodiment

A third embodiment forms a passive element on a cap substrate.

FIG. 8A through FIG. 9D are schematic cross-sectional views illustrating a fabrication process of an acoustic wave device in accordance with the third embodiment. FIG. 8A through FIG. 8E are diagrams illustrating a fabrication process of the cap substrate 40, and a detailed description of steps in common with those of the first embodiment (FIG. 2) is omitted. In addition, the fabrication process of the support substrate 10 is the same as that of the first embodiment (FIG. 1), and thus a description thereof is omitted.

Figure 8A:
FIG. 8A through FIG. 8E are schematic cross-sectional views (No. 1) illustrating a fabrication process of an acoustic wave device in accordance with a third embodiment.
Figure 8B:
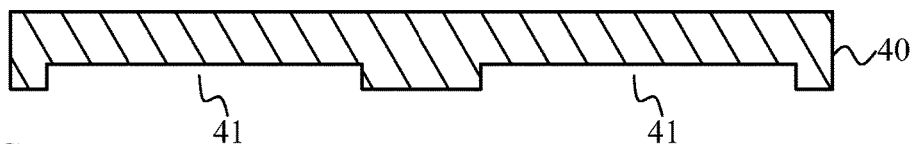
Figure 8C:
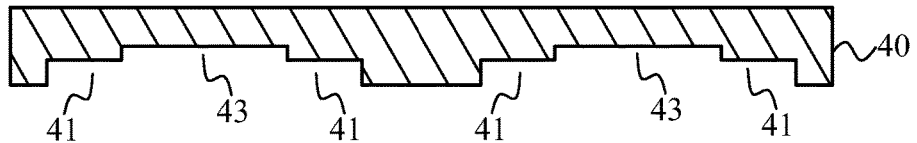
Figure 8D:
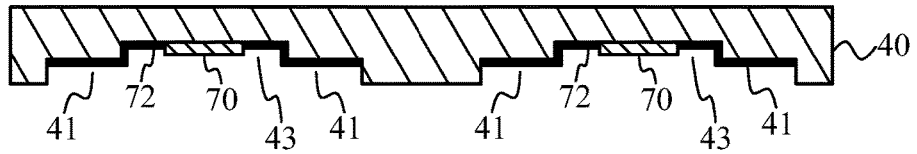
Figure 8E:
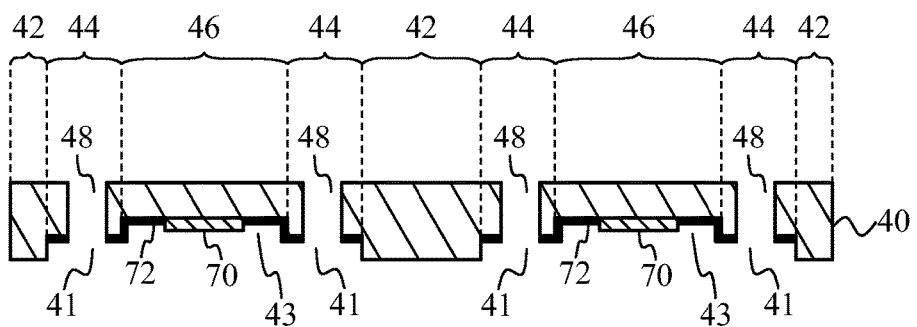

First, as illustrated in FIG. 8A through FIG. 8C, the first recess portions 41 and the second recess portions 43 are sequentially formed in the cap substrate 40. The depth of the second recess portion 43 is determined in consideration of depths of an IPD and a cap wiring described later so that they do not make contact with the elements of the piezoelectric substrate 20 when sealed. Then, as illustrated in FIG. 8D, an IPD 70 (Integrated Passive Device), which is an exemplary passive element, is formed on the surface of the second recess portion 43 and a cap wiring 72 electrically connected to the IPD 70 is formed in the second recess portion 43 and the first recess portion 41. The cap wiring 72 may be made of, for example, aluminum. When the formation of the cap substrate 40 is completed, the penetration holes 48 penetrating through the second region 44 of the cap substrate 40 are formed as illustrated in FIG. 8E.

Figure 9A:
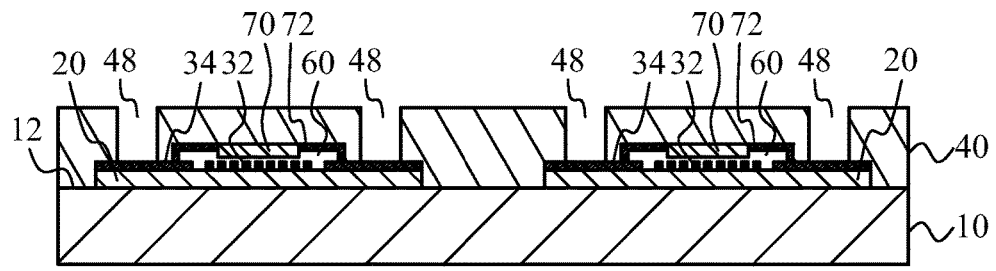
FIG. 9A through FIG. 9D are schematic cross-sectional views (No. 2) illustrating the fabrication process of the acoustic wave device in accordance with the third embodiment.
Figure 9B:
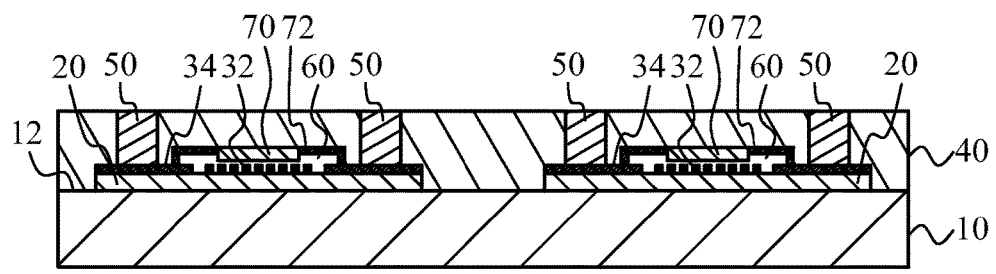
Figure 9C:
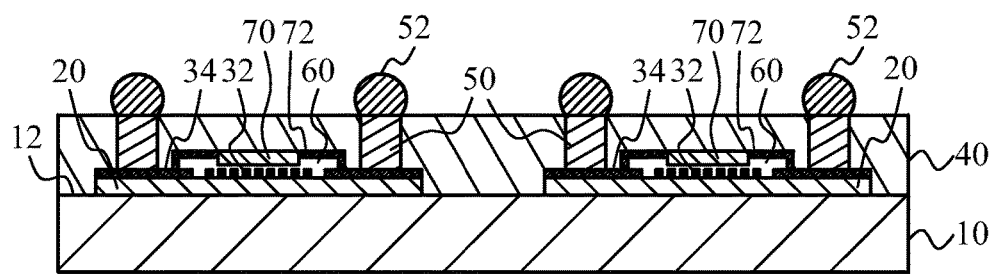
Figure 9D:
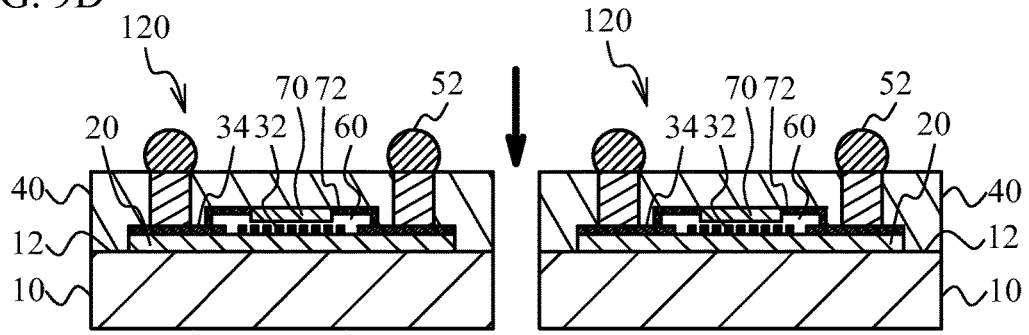

Then, as illustrated in FIG. 9A, the cap substrate 40 is bonded to the support substrate 10 and the piezoelectric substrate 20. At this time, the first region 42 of the cap substrate 40 is bonded to the surface 12 of the support substrate 10, and the second region 44 of the cap substrate 40 is bonded to the surface of the piezoelectric substrate 20. Additionally, the IPD 70 located in the third region 46 of the cap substrate 40 is located away from the excitation electrodes 32 and the wiring electrodes 34 of the piezoelectric substrate 20. Then, as illustrated in FIG. 9B through FIG. 9D, performed are the formation step of the penetrating electrode 50, the formation step of the solder ball 52, and the dicing step in the same manner as those of the first embodiment. The above-described process completes acoustic wave devices 120 in accordance with the third embodiment.

Figure 10:
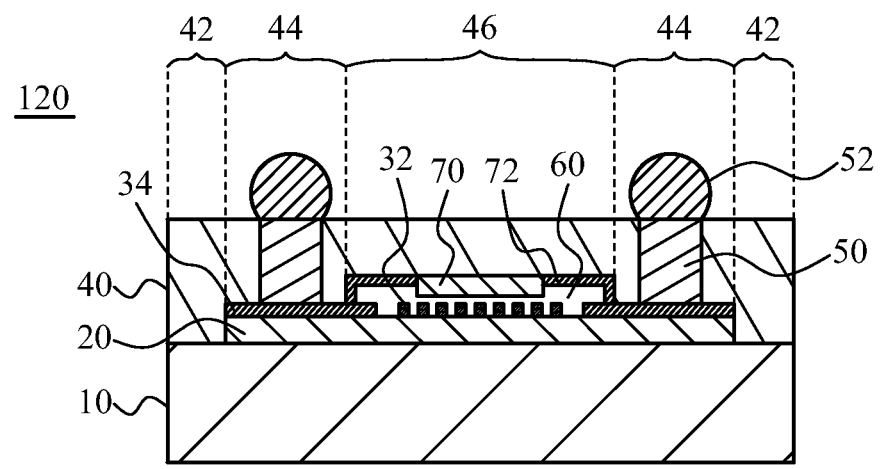
FIG. 10 is a schematic cross-sectional view illustrating a structure of the acoustic wave device in accordance with the third embodiment.

FIG. 10 is a schematic cross-sectional view illustrating a structure of the acoustic wave device 120 in accordance with the third embodiment. Unlike the first embodiment, the IPD 70 is located on the cap substrate 40, and the IPD 70 is electrically connected to the wiring electrodes 34 and the excitation electrodes 32 of the piezoelectric substrate 20 through the cap wiring 72. The cap wiring 72 and the wiring electrode 34 are interconnected in the second region 44 of the cap substrate 40.

Figure 11A:
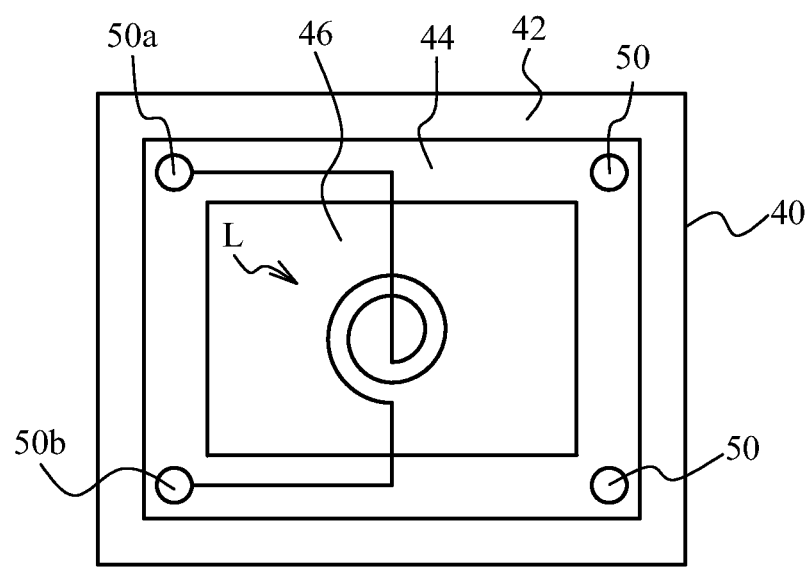
FIG. 11A and FIG. 11B are a schematic plan view and a circuit diagram illustrating the structure of the acoustic wave device in accordance with the third embodiment, respectively.
Figure 11B:
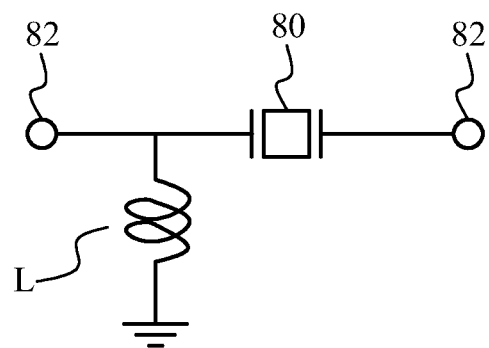

FIG. 11A is a schematic plan view illustrating the structure of the acoustic wave device 120 in accordance with the third embodiment, and FIG. 11B is a circuit diagram of the acoustic wave device 120. FIG. 11A illustrates the structure when the cap substrate 40 is viewed from the support substrate 10 side as with FIG. 6A of the first embodiment, and a description of common parts is omitted.

As illustrated in FIG. 11A, a spiral inductor L is formed as the IPD 70 between a penetrating electrode 50a connected to the input/output pad 34a and a penetrating electrode 50b connected to the ground pad 34b. As illustrated in FIG. 11B, a resonator 80 is formed by an electrode pattern including the excitation electrodes 32 formed on the piezoelectric substrate 20. The resonator 80 is connected between two input/output terminals 82, and a first end of the resonator 80 is grounded through the inductor L.

Also in the acoustic wave device 120 of the third embodiment, the hermeticity and the reliability of the acoustic wave device 120 can be improved by forming a level difference in the cap substrate 40, bonding the first region 42 to the support substrate 10, and bonding the second region 44 to the piezoelectric substrate 20 as described in the first embodiment. Furthermore, the acoustic wave device 120 of the third embodiment can be further reduced in size by forming the IPD 70 on the third region (the second recess portion 43) of the cap substrate 40.

Figure 12A:
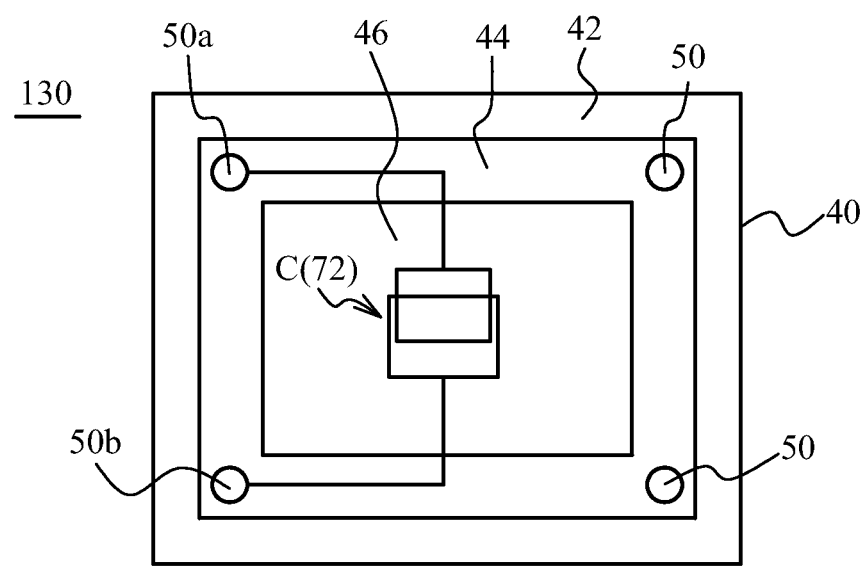
FIG. 12A and FIG. 12B are a schematic plan view and a circuit diagram illustrating a structure of an acoustic wave device in accordance with a variation of the third embodiment, respectively.
Figure 12B:
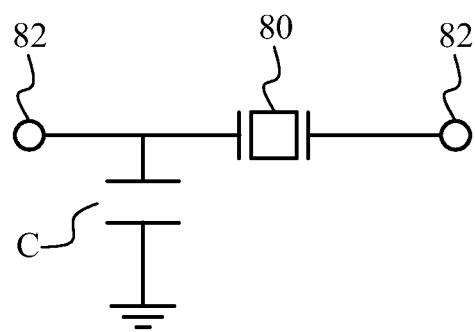

FIG. 12A is a schematic plan view illustrating a structure of an acoustic wave device 130 in accordance with a variation of the third embodiment, and FIG. 12B is a circuit diagram of the acoustic wave device 130. As illustrated in FIG. 12A, a multilayer capacitor C is formed as the IPD 70 between the penetrating electrodes 50a and 50b. As illustrated in FIG. 11B, a first end of the resonator 80 is grounded through the capacitor C. Other structures are the same as those of the third embodiment. As described above, the capacitor C may be used as the IPD 70.

The structures described in the first through third embodiments can be applied to various acoustic wave devices including a functional element formed by the excitation electrode 32 and the space 60. For example, they can be applied to surface acoustic wave (SAW) devices, boundary acoustic wave devices, and Love wave devices.

Although the embodiments of the present invention have been described in detail, it is to be understood that the various change, substitutions, and alterations could be made hereto without departing from the spirit and scope of the invention.

What is claimed is:

1. An acoustic wave device comprising:
   a support substrate made of sapphire or silicon;
   a piezoelectric substrate located on the support substrate so that a surface of an outer peripheral portion of the support substrate is exposed;
   an excitation electrode located on the piezoelectric substrate and exciting an acoustic wave; and
   a cap substrate located on the support substrate and the piezoelectric substrate and made of an inorganic insulating material, wherein
   the cap substrate includes a first region located along an outer peripheral portion of the cap substrate, a second region located along an inside of the first region and having a thickness less than a thickness of the first region, and a third region located inside the second region and having a thickness less than a thickness of the second region, and
   a surface of the first region is bonded to the surface of the outer peripheral portion of the support substrate, a surface of the second region is bonded to a surface of an outer peripheral portion of the piezoelectric substrate, and a surface of the third region is located away from a surface of the piezoelectric substrate to form a space for the excitation electrode to vibrate.

2. The acoustic wave device according to claim 1, wherein the support substrate and the cap substrate have linear expansion coefficients less than a linear expansion coefficient of the piezoelectric substrate.

3. The acoustic wave device according to claim 1, wherein the support substrate and the cap substrate are formed of a same material.

4. The acoustic wave device according to claim 1, wherein the piezoelectric substrate and the excitation electrode are both provided in a plurality on said support substrate, and said space is provided in a plurality on said support substrate, respectively corresponding to the plurality of the excitation electrodes on the piezoelectric substrates.

5. The acoustic wave device according to claim 1, further comprising:
   a passive element located in the third region of the cap substrate and electrically connected to the excitation electrode.

6. The acoustic wave device according to claim 1, further comprising:
   a penetrating electrode penetrating through the second region of the cap substrate and electrically connected to the excitation electrode.

7. The acoustic wave device according to claim 1, wherein the cap substrate is made of sapphire or alumina.

8. The acoustic wave device according to claim 1, further comprising:
   at least one of an inductor and a capacitor located in the third region of the cap substrate, electrically connected to the excitation electrode and faces the excitation electrode across the space.

9. An acoustic wave device comprising:
a support substrate made of alumina;
a piezoelectric substrate located on the support substrate so that a surface of an outer peripheral portion of the support substrate is exposed;
an excitation electrode located on the piezoelectric substrate and exciting an acoustic wave; and
a cap substrate located on the support substrate and the piezoelectric substrate and made of an inorganic insulating material, wherein
the cap substrate includes a first region located along an outer peripheral portion of the cap substrate, a second region located along an inside of the first region and having a thickness less than a thickness of the first region, and a third region located inside the second region and having a thickness less than a thickness of the second region, and
a surface of the first region is bonded to the surface of the outer peripheral portion of the support substrate, a surface of the second region is bonded to a surface of an outer peripheral portion of the piezoelectric substrate, and a surface of the third region is located away from a surface of the piezoelectric substrate to form a space for the excitation electrode to vibrate.

10. A method of fabricating an acoustic wave device comprising:
providing a piezoelectric substrate on a support substrate made of sapphire, alumina, or silicon so that a surface of an outer peripheral portion of the support substrate is exposed;
providing an excitation electrode on the piezoelectric substrate, the excitation electrode exciting an acoustic wave;
forming a first region, a second region, and a third region in a cap substrate made of an inorganic insulating material, the first region being located along an outer peripheral portion of the cap substrate, the second region being located along an inside of the first region and having a thickness less than a thickness of the first region, and the third region being located inside the second region and having a thickness less than a thickness of the second region; and
sealing the excitation electrode by the cap substrate by bonding a surface of the first region to the surface of the outer peripheral portion of the support substrate, bonding a surface of the second region to a surface of an outer peripheral portion of the piezoelectric substrate, and locating a surface of the third region away from a surface of the piezoelectric substrate to form a space for the excitation electrode to vibrate.

\* \* \* \* \*